(12) United States Patent
Boyle et al.

(10) Patent No.: US 8,048,774 B2
(45) Date of Patent: Nov. 1, 2011

(54) METHODS AND SYSTEMS FOR LASER MACHINING A SUBSTRATE

(75) Inventors: Adrian A. Boyle, Monasterevin (IE); Oonagh Meignan, Dublin (IE)

(73) Assignee: Electro Scientific Industries, Inc., Portland, OR (US)

( * ) Notice: Subject to any disclaimer, the term of this patent is extended or adjusted under 35 U.S.C. 154(b) by 328 days.

(21) Appl. No.: 10/490,985

(22) PCT Filed: Oct. 1, 2002

(86) PCT No.: PCT/EP02/11001
§ 371 (c)(1),
(2), (4) Date: Aug. 20, 2004

(87) PCT Pub. No.: WO03/028949
PCT Pub. Date: Apr. 10, 2003

(65) Prior Publication Data
US 2004/0259329 A1    Dec. 23, 2004

(30) Foreign Application Priority Data

Oct. 1, 2001   (IE) .................................. S2001/0864
Apr. 26, 2002  (IE) .................................... 2002/0315

(51) Int. Cl.
*H01L 21/33* (2006.01)

(52) U.S. Cl. .. 438/459; 438/977; 438/460; 257/E21.482

(58) Field of Classification Search .......... 438/459–463, 438/977
See application file for complete search history.

(56) References Cited

U.S. PATENT DOCUMENTS

| | | | |
|---|---|---|---|
| 4,023,280 A | 5/1977 | Schneider | |
| 5,217,916 A | 6/1993 | Anderson et al. | |
| 5,397,420 A * | 3/1995 | Sakakibara et al. | 156/345.33 |
| 5,597,767 A | 1/1997 | Laurinda et al. | |
| 5,614,114 A * | 3/1997 | Owen | 219/121.66 |
| 5,646,067 A * | 7/1997 | Gaul | 438/458 |
| 5,691,248 A | 11/1997 | Howell et al. | |
| 5,737,818 A * | 4/1998 | Frank et al. | 216/17 |
| 6,004,867 A * | 12/1999 | Kim et al. | 438/459 |
| 6,074,896 A | 6/2000 | Dando | |
| 6,245,587 B1 * | 6/2001 | Vallett | 438/18 |
| 6,507,092 B1 * | 1/2003 | Fukasawa et al. | 257/620 |

* cited by examiner

*Primary Examiner* — Thanh Nguyen
(74) *Attorney, Agent, or Firm* — McDonnell Boehnen Hulbert & Berghoff LLP

(57) ABSTRACT

A formation in a first surface of a substrate is machined by an ultraviolet or visible radiation laser, to a predetermined depth that is less than a full depth of the substrate; and material is removed from a second surface of the substrate opposed to the first surface to the predetermined depth from the first surface to communicate with the formation. Material may be removed by, for example, lapping and polishing, chemical etching, plasma etching or laser ablation. The invention has application in, for example, dicing semiconductor wafers to forming metallised vias in wafers.

18 Claims, 4 Drawing Sheets

METHODS AND SYSTEMS FOR LASER MACHINING A SUBSTRATE

TECHNICAL FIELD

The invention relates to machining substrates, particularly, but not limited to, semiconductor wafers.

BACKGROUND ART

It is known to dice semiconductor wafers with dicing saws and throughput has been a function of machining speed, alignment time, and yield.

DISCLOSURE OF INVENTION

According to a first aspect of the invention, there is provided a method of machining a substrate comprising the steps of: (a) using a laser emitting visible or ultraviolet radiation to machine a formation in a first surface of the substrate to a predetermined depth from the first surface that is less than a full depth of the substrate; and (b) removing material from a second surface of the substrate opposed to the first surface to the predetermined depth from the first surface to communicate with the formation.

Conveniently, step (a) comprises laser machining with a laser emitting radiation of a wavelength of one of substantially 266 nm, 355 nm and 532 nm.

Advantageously, step (a) comprises machining a channel, and step (b) comprises completing a cut through the substrate at the channel.

Conveniently, step (a) comprises machining a channel with substantially plane opposed side walls between the first surface and the predetermined depth from the first surface and substantially arcuate opposed side walls below the predetermined depth.

Advantageously, step (a) comprises machining a grid of channels, and step (b) completes dicing of the substrate along the grid of channels.

Alternatively, step (a) comprises machining a via and metallising the via with metal, and step (b) comprises exposing a portion of the metal in the via at the second surface.

Conveniently, the step of machining a via comprises machining in a path forming a circle or a plurality of concentric circles to form a via centred on a centre of the circle or the plurality of concentric circles.

Preferably, the step of metallising the via includes a prior step of oxidising the via.

Preferably, step (a) is performed in a non-ambient controlled gas environment, using at least one of a reactive gas and a passive gas at least one of prior to, during and after laser machining.

Advantageously, the step of using at least one of a reactive and a passive gas comprises using at least one passive gas substantially inert with respect to the substrate substantially to prevent oxidation of the substrate during laser machining thereof.

Conveniently, the step of using at least one passive gas comprises using at least one of argon and helium.

Advantageously, the step of using at least one of a reactive and a passive gas comprises using at least one gas reactive with respect to the substrate, to reduce roughness of laser-machined surfaces formed in step (a).

Advantageously, the step of using at least one of a reactive and a passive gas comprises using at least one gas reactive with respect to the substrate, to remove debris created in step (a).

Conveniently, the step of using at least one gas reactive with respect to the substrate comprises using at least one of a chloroflurocarbon-based gas and a halocarbon-based gas.

Conveniently, step (b) is performed by mechanically removing material, particularly by lapping and polishing.

Optionally, step (b) is performed by chemical etching.

Optionally, step (b) is performed by plasma etching.

Optionally, step (b) is performed by laser ablation.

Conveniently, step (b) comprises the application of mechanical pressure to the substrate to break the substrate along the channel.

Advantageously, step (a) comprises a further step of providing a protective layer for the first surface against debris formed in at least one of step (a) and step (b).

Conveniently, the step of providing a protective layer comprises providing a spin coated layer.

Alternatively, the step of providing a protective layer comprises providing a tape layer.

Conveniently, the substrate is of silicon material.

Optionally, the substrate is of an optoelectronic material.

Optionally, the substrate comprises layers of semiconductor and metal material.

Preferably, step (a) comprises laser machining with a Q-switched laser.

According to a second aspect of the invention, there is provided a substrate machining system comprising: laser machining means for emitting visible or ultraviolet radiation for machining a formation in a first surface of a substrate to a predetermined depth from the first surface that is less than a full depth of the substrate; and material removal means for removing material from a second surface of the substrate opposed to the first surface to the predetermined depth from the first surface to communicate with the machined formation.

Conveniently, the laser machining means is arranged to machine a channel, and the material removal means is arranged to complete a cut through the substrate at the channel.

Advantageously, the laser machining means is arranged to machine a channel having substantially planar opposed side walls between the first surface and the predetermined depth from the first surface and substantially arcuate opposed walls beyond the predetermined depth.

Preferably, the laser machining means is arranged to machine a grid of channels, and the material removal means is arranged to complete dicing of the substrate along the grid of channels.

Alternatively, the laser machining means is arranged to machine a via, the system further comprises metallising means for metallising the via, and the material removal means is arranged to expose metal in the via at the second surface.

Preferably, the system further comprises oxidising means for oxidising the via prior to metallization.

Preferably, the system further comprises gas handling means for providing at least one of a reactive gas environment and a passive gas environment for the substrate at least one of prior to, during and after laser machining.

Conveniently, the material removal means is mechanical removal means, particularly lapping and polishing means.

Optionally, the material removal means is chemical etching means.

Optionally, the material removal means is plasma etching means.

Optionally, the material removal means is laser ablation means.

Advantageously, the system is arranged for machining silicon material.

Optionally, the system is arranged for machining a substrate comprising layers of semiconductor and metal material Optionally, the system is arranged for machining a substrate comprising optoelectronic material.

Preferably, the laser machining means comprises a Q-switched laser.

Conveniently, the laser machining means is arranged to emit radiation of a wavelength of one of substantially 266 nm, 355 nm and 532 nm.

BRIEF DESCRIPTION OF THE DRAWINGS

The invention will be more clearly understood from the following description of some embodiments thereof, given by way of example only with reference to the accompanying drawings in which.

MODES FOR CARRYING OUT THE INVENTION

Figure 1:
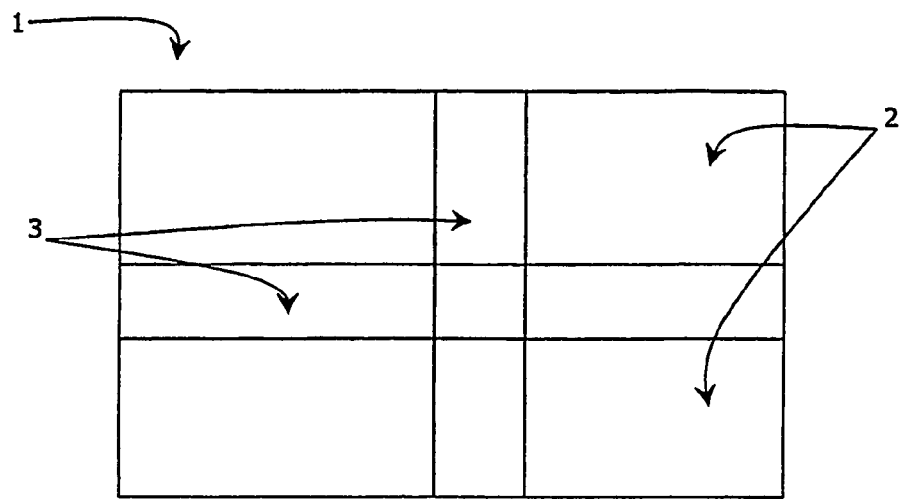
FIG. 1 is a plan view of a semiconductor wafer before dicing.
Figure 2:
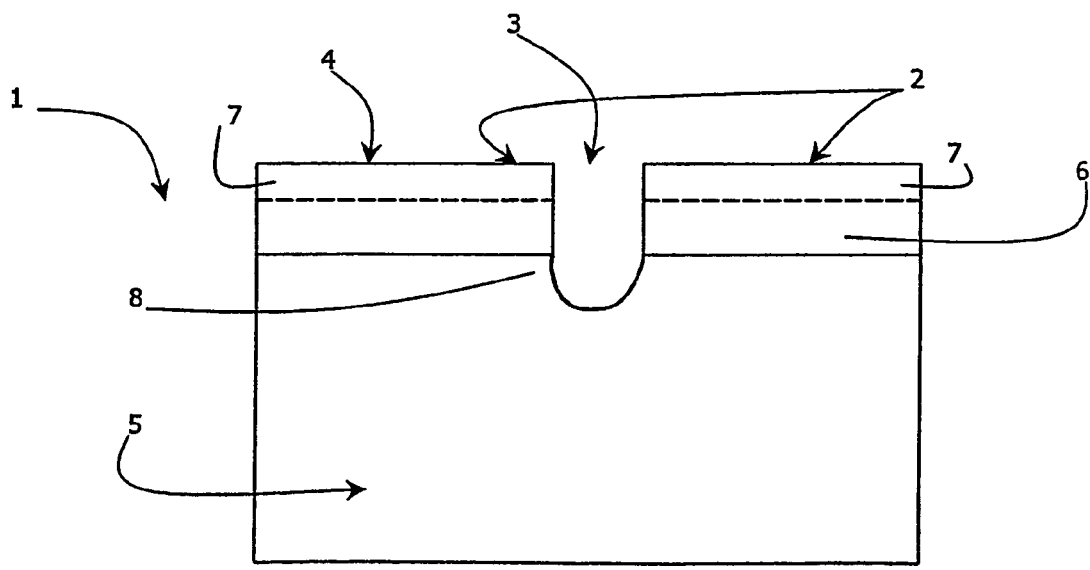
FIG. 2 is a diagrammatic cross-sectional view of the wafer of FIG. 1 showing an active region and a support region of the wafer, and a laser-machined channel.

Referring to FIG. 1, part of a semiconductor wafer 1 is shown. The semiconductor wafer comprises integrated circuit dies 2 separated by streets 3. As shown in FIG. 2, each die 2 comprises an active region 4 supported by a support region 5 providing mechanical support during manufacture. Within the active region 4 there is an upper active circuit layer 7 and a lower final support layer 6.

Generally, the active region 4 is of thickness less than 100 microns. Generally, the active region 4 may be an integrated electronic circuit but may also be an optical waveguide circuit.

It is a requirement that the wafer is sufficiently thick that it is mechanically robust. For large area wafers, e.g. 300 mm wafers, typically this thickness may be in the region of 500 microns to 800 microns. Heretofore, dicing of the wafer has been performed with dicing saws and throughput has been a function of machining speed, alignment time, and yield.

The invention employs an alternative technique using a combination of laser street machining and backside wafer thinning.

In the first step, a laser is used to scribe a channel 8 (FIG. 2) of depth d and width w into the street region. To achieve a high machining speed a high power Q-switched laser operating within a band of substantially 10 nm centred on 266 nm, 355 nm or 532 nm may be used. Using an appropriate set of laser, scan, and optical parameters, the street may be machined at high speed without affecting the functionality of devices in the active region 4. Typically, channels 8 of 20 to 100 microns depth may be machined at speeds up to 80 mm/s with appropriate laser settings. As shown in FIG. 2, the channel 8 may have substantially plane opposed side walls between the first surface and a predetermined depth and substantially arcuate opposed walls below the predetermined depth.

Figure 3:
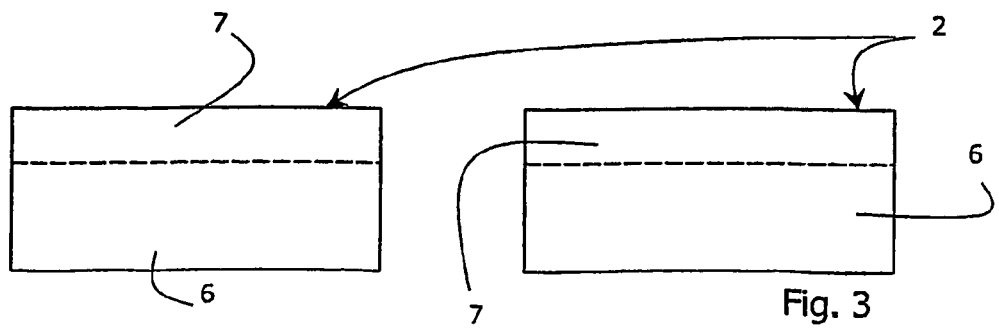
FIG. 3 is the diagrammatic view of FIG. 2 with the support region removed.

Once the street 3 is machined to a required depth, the support region 5 of the wafer is thinned by lapping and polishing, chemical etching, plasma etching, or laser ablation. This thinning provides final separated dies 2 shown in FIG. 3. The result is a diced wafer. The active circuit layer 7 is supported by the final support layer 6.

Figure 4A:
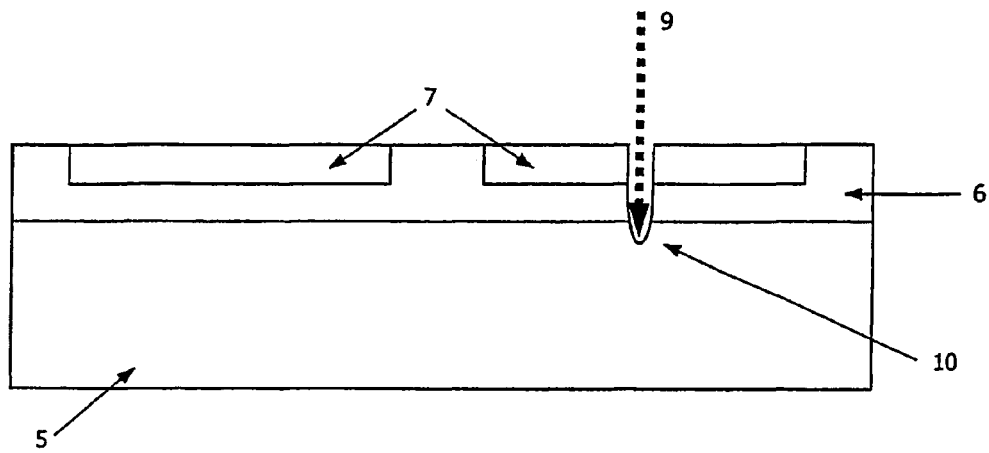
FIGS. 4(a), 4(b) and 4(c) are a series of cross-sectional diagrams showing a machining process of the invention.
Figure 4B:
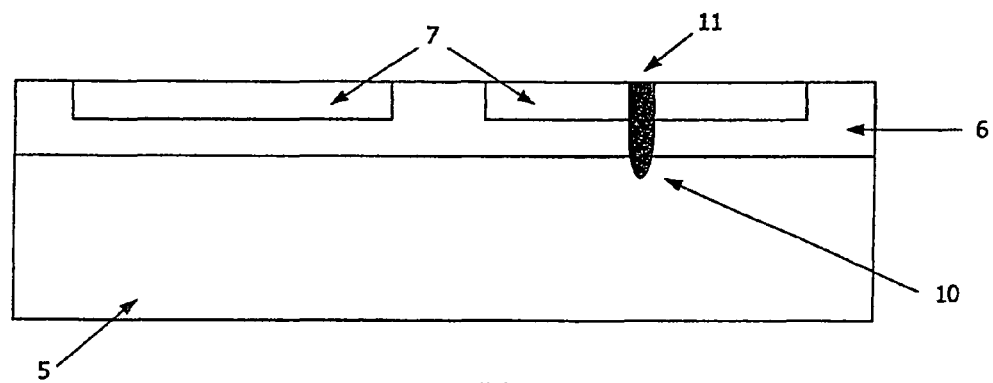
Figure 4C:
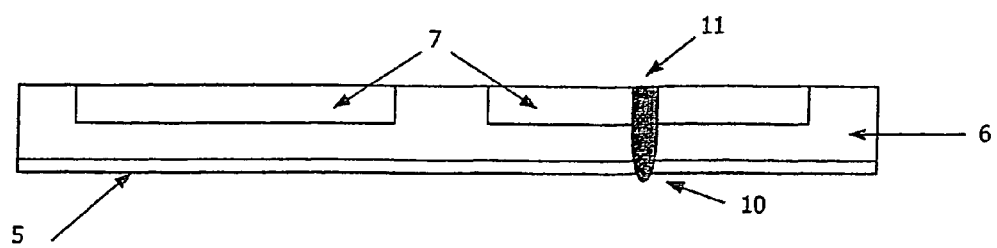

In another embodiment of this invention illustrated in FIGS. 4(a) to 4(c), a Q-switched laser beam 9 is used to drill microvia features 10 through the active circuit layer 7 and supporting substrate layer 6 down to the supporting structure 5 as shown in FIG. 4(a). The microvias 10 are then metallised with metal 11, to facilitate electrical connection of the active circuit layer 7.

Drilling of microvias 10 with pulsed lasers may be performed using one of two methods. In a first method a stationary beam is used (pixel vias). Using this technique a number of laser pulses are delivered to a single point on the substrate. The number of pulses required to reach a certain depth depends on their energy, wavelength and duration. This technique is suitable for vias smaller than approximately 100 microns diameter. The exact via diameter depends on the laser beam diameter, optical and laser parameters and material properties. In a second method a beam is scanned along the outer profile of the via. This technique is suitable for vias larger than approximately 100 microns diameter.

The laser moves in a circular pattern, in a single circle or a plurality of concentric circles. Several repetitions might be required to reach the required depth. The via diameter is a function of the radius of the outermost circle and the beam diameter. Such a via is referred to as a scanned or trepanned via.

By machining the microvia 10, be it a pixel or trepanned via, to the required depth in the wafer material, a blind microvia structure is formed which is subsequently filled with metal 11 in order to provide a conducting pathway as shown in FIG. 4(b). The microvia may be oxidised before metallization. The backside of the wafer is then thinned (FIG. 4(c)) by lapping and polishing, chemical etching, or plasma etching in order to expose the metal in the laser machined microvia, thus permitting electrical connection of devices in the active circuit layer to power and ground sources.

Figure 5A:
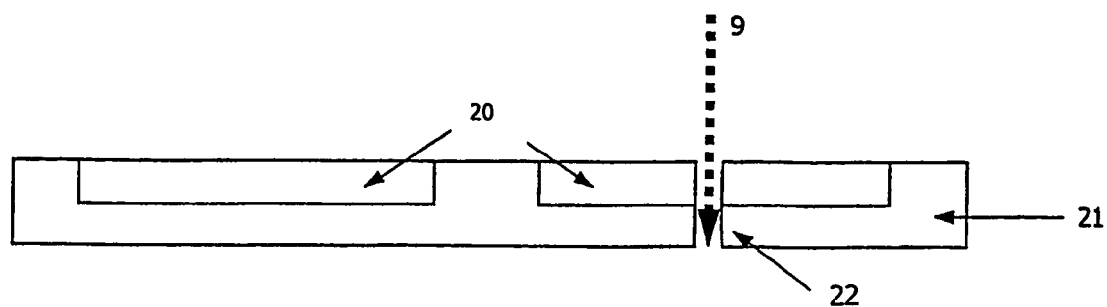
FIGS. 5(a) and 5(b) are cross-sectional diagrams illustrating an alternative machining process helpful in understanding the invention.
Figure 5B:
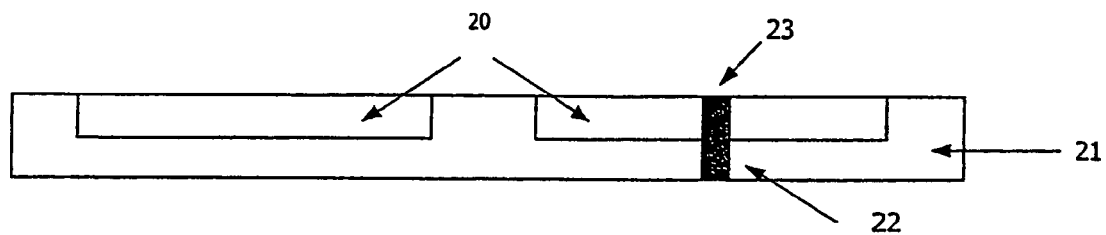

Referring to FIGS. 5(a) and 5(b), in the case where the wafer on which the active devices are located is thin (typically <300 microns), vias are laser machined through the active layer 20 and completely through the supporting substrate 21. The via 22 is then metallised with metal 23 subsequent to oxidisation in order to facilitate electrical connection (FIG. 5(b)).

Figure 6A:
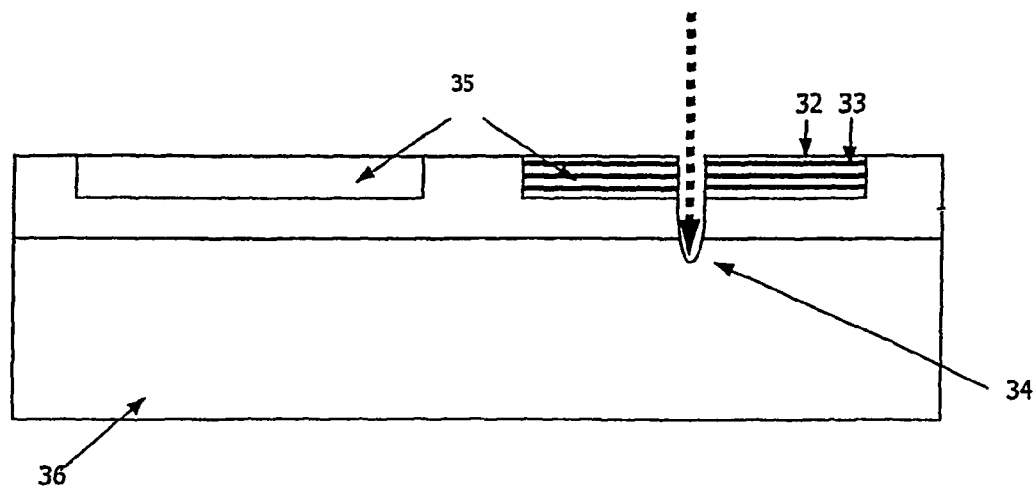
FIGS. 6(a), 6(b), and 6(c) are cross-sectional diagrams illustrating a further embodiment of the machining process of the invention.
Figure 6B:
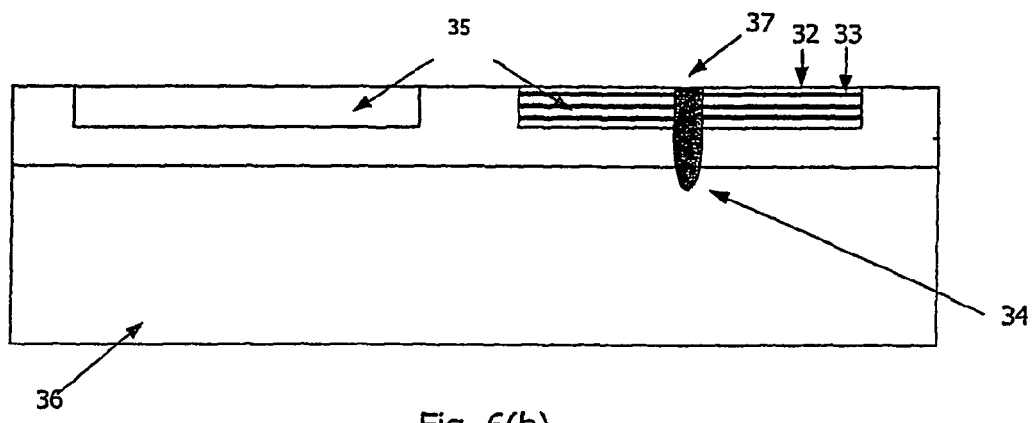
Figure 6C:
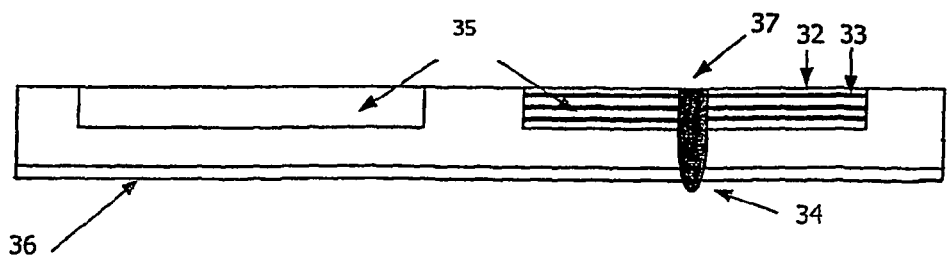

Referring to FIGS. 6(a) to 6(c), in a further embodiment of the invention, the active device consists of a series of alternate silicon layers 32 and metal layers 33 as shown in FIG. 6(a). A Q-switched laser is used to drill a microvia structure 34 from the surface of an active device 35, through this active device layer and into the supporting substrate 36 (FIG. 6(b)). The microvia 34 is then metallised with metal 37.

The backside of the wafer is then thinned (FIG. 6(c)) by lapping and polishing, chemical etching, plasma etching or laser ablation in order to expose the metal layer in the laser machined microvia, thus permitting electrical connection of device layers to power and ground sources.

The laser machining may be performed in a non-ambient gas environment controlled by a gas handling system. Gas parameters such as flow rate, concentration, temperature, gas type and gas mixes are controlled prior to, during and after laser machining. A series of gases may be used in succession prior to, during and/or after laser machining.

The gases used may be passive or reactive with respect to the semiconductor substrate and/or layers in the semiconductor substrate to be machined. Inert gases (e.g. argon and helium) prevent oxide growth during laser machining. Gases that react with silicon (e.g. chlorofluorocarbons and halocarbons) may be used prior to, during and/or after laser machining to reduce the surface roughness of laser machined sidewalls and also to reduce the debris produced during the laser machining process.

A chlorofluorocarbon-based gas and/or a halocarbon-based gas may be used during a laser scan of die sidewalls in order to remove debris located on the sidewalls of the laser machined channel or via.

A chlorofluorocarbon-based gas and/or a halocarbon-based gas may be used during a laser scan of the outer rim of the machined channel or via in order to remove debris from the top of the laser machined surface.

The surface of the substrate that the laser is incident upon may be spin coated with a protective layer to prevent debris from the laser machining or mechanical machining steps falling on the active device layer 4.

The surface of the substrate that the laser is incident may be covered with a tape to act as a protective layer preventing debris from the laser machining or mechanical machining steps falling on the active device layer 4.

Following laser machining, the laser machined surface of the substrate may be coated with a back grinding tape, die attach tape or dicing tape in order to facilitate holding of die after the mechanical machining process.

The invention is not limited to the embodiments described but may be varied in construction and detail.

The invention claimed is:

1. A method of machining a substrate comprising the steps of:
   (a) using a laser emitting visible or ultraviolet radiation to machine a formation in a first surface of the substrate to a predetermined depth from the first surface that is less than a full depth of the substrate; and
   (b) subsequently removing material from a second surface of the substrate opposed to the first surface to the predetermined depth from the first surface to communicate with the formation using one of: chemical etching; plasma etching; and laser ablation,
   wherein step (a) is performed in a non-ambient controlled gas environment, using at least one of a reactive gas and a passive gas at least one of prior to, during and after laser machining, wherein using the passive gas comprises using a passive gas substantially inert with respect to the substrate substantially to prevent oxidation of the substrate during laser machining thereof, and wherein using the reactive gas comprises using gas reactive with respect to the substrate to reduce roughness of laser-machined surfaces formed in step (a) or to remove debris created in step (a).

2. A method as claimed in claim 1, wherein step (a) comprises laser machining with a laser emitting radiation of a wavelength of one of substantially 266 nm, 355 nm and 532 nm.

3. A method as claimed in claim 1, wherein the step of machining the formation comprises machining a channel, and step (b) completes a cut through the substrate at the channel.

4. A method as claimed in claim 3, wherein step (a) comprises machining a channel with substantially planar opposed side walls between the first surface and the predetermined depth from the first surface and substantially arcuate opposed side walls below the predetermined depth.

5. A method as claimed in claim 3, wherein step (a) comprises machining a grid of channels, and step (b) completes dicing of the substrate along the grid of channels.

6. A method as claimed in claim 3, wherein step (b) comprises the application of mechanical pressure to the substrate to break the substrate along the channel.

7. A method as claimed in claim 1, wherein step (a) of machining the formation comprises machining a via and metallising the via with metal, and step (b) comprises exposing a portion of the metal in the via at the second surface using one of: mechanically removing material, particularly by using one of chemical etching; plasma etching; and laser ablation.

8. A method as claimed in claim 7, wherein the step of machining a via comprises machining in a path forming a circle or a plurality of concentric circles to form a via centered on a center of the circle or the plurality of concentric circles.

9. A method as claimed in claim 7, wherein the step of metallising the via includes a prior step of oxidising the via.

10. A method as claimed in claim 1, wherein the step of using a passive gas comprises using one of argon or helium.

11. A method as claimed in claim 1, wherein using gas reactive with respect to the substrate comprises using at least one of a chloroflurocarbon-based gas and a halocarbonbased gas.

12. A method as claimed in claim 1, wherein step (a) comprises a further step of providing a protective layer for the first surface against debris formed in at least one of step (a) and step (b).

13. A method as claimed in claim 12, comprising providing a spin coated protective layer.

14. A method as claimed in claim 12, comprising providing a tape as the protective layer.

15. A method as claimed in claim 1, wherein the substrate is of silicon material.

16. A method as claimed in claim 1, wherein the substrate is of an optoelectronic material.

17. A method as claimed in claim 1, wherein the substrate comprises layers of semiconductor and metal material.

18. A method as claimed in claim 1, wherein step (a) comprises laser machining with a Q-switched laser.

* * * * *